United States Patent [19]

Dingwall

[11] E Re. 28,952

[45] Reissued Aug. 31, 1976

[54] SHAPED RISER ON SUBSTRATE STEP FOR PROMOTING METAL FILM CONTINUITY

[75] Inventor: Andrew Gordon Francis Dingwall, Somerville, N.J.

[73] Assignee: RCA Corporation, New York, N.Y.

[22] Filed: June 3, 1974

[21] Appl. No.: 476,087

Related U.S. Patent Documents

Reissue of:

[64] Patent No.: 3,703,667
Issued: Nov. 21, 1972
Appl. No.: 125,302
Filed: Mar. 17, 1971

[52] U.S. Cl. ..... 357/65; 357/23; 357/52; 357/68

[51] Int. Cl.[2] ..... H01L 23/48; H01L 29/40; H01L 29/78; H01L 29/44

[58] Field of Search ..... 357/23, 24, 38, 65, 357/52, 68

[56] References Cited

UNITED STATES PATENTS

| | | | |
|---|---|---|---|
| 3,246,173 | 4/1966 | Silver | 317/235 B |
| 3,339,128 | 8/1967 | Olmstead et al. | 317/235 B |
| 3,374,406 | 3/1968 | Wallmark | 317/235 B |
| 3,528,168 | 9/1970 | Adamic | 317/235 B |
| 3,688,389 | 9/1972 | Nakanuma et al. | 357/23 |
| 3,739,237 | 6/1973 | Shannon | 357/23 |
| 3,761,785 | 9/1973 | Pruniaux | 357/23 |
| 3,859,717 | 1/1975 | Green | 357/24 |

FOREIGN PATENTS OR APPLICATIONS

| | | | |
|---|---|---|---|
| 1,207,305 | 9/1970 | United Kingdom | 357/38 |

*Primary Examiner*—Andrew J. James
*Attorney, Agent, or Firm*—H. Christoffersen; R. P. Williams

[57] ABSTRACT

In integrated circuit devices which have insulating coatings with portions of different thickness bounded by relatively high steps and deposited metal conductors on the coatings, yield losses often result from breaks in the metal conductors at the steps. By shaping the insulator step with an offset wherever a metal crossing is required, the probability of such breaks is reduced.

9 Claims, 6 Drawing Figures

INVENTOR.
Andrew G.F. Dingwall
BY
Robert P. Williams
ATTORNEY

INVENTOR.
Andrew G. F. Dingwall
BY
Robert P. Williams
ATTORNEY

SHAPED RISER ON SUBSTRATE STEP FOR PROMOTING METAL FILM CONTINUITY

Matter enclosed in heavy brackets [ ] appears in the original patent but forms no part of this reissue specification; matter printed in italics indicates the additions made by reissue.

BACKGROUND OF THE INVENTION

This invention relates to semiconductor devices which include deposited metal layers.

Among the devices to which this invention applies are monolithic integrated circuit devices of the type which include a body of semiconductor material having an insulating coating with portions of different thickness and deposited metal conductors on and adhered to the insulating coating. One such device is an MOS integrated circuit device which employs plurality of insulated gate field effect transistors with a relatively thin insulator in the gate areas of the transistors and a relatively thick insulating coating in the areas surrounding the transistors.

The purpose of the thick insulating coating in known integrated circuit devices is to reduce the capacitance interaction between the deposited conductors and the adjacent regions of the semiconductor body. This improves the speed of the circuit and reduces the changes of leakage due to parasitic inversion layers at the surface of the semiconductor body.

A significant yield loss problem has heretofore limited the maximum thickness difference between the thin and thick insulator layers. As this difference, or step height is made greater, the probability of open circuits due to breaks in the metal conductors at the steps increases. Past attempts to overcome this problem have not been commercially successful. One known approach has been to establish a sloped riser surface joining the thick and thin insulating coatings. This may be accomplished, for example, by growing an oxide coating the density of which is graded from relatively high adjacent to the semiconductor to relatively low at the free surface of the coating. When such an oxide is etched, it etches faster at the free surface than at the side adjacent to the semiconductor and consequently a surface of relatively gradual slope is achieved. An insulating coating of graded density is, however, difficult to produce.

SUMMARY OF THE INVENTION

In devices having metal layers which are required to cross relatively high steps, yield losses of the type described above can be reduced by shaping the riser surfaces of the steps with at least two non-coplanar portions. Correspondingly, greater step heights can be achieved without significant reductions in yield.

THE DRAWINGS

DESCRIPTION

Figure 1:
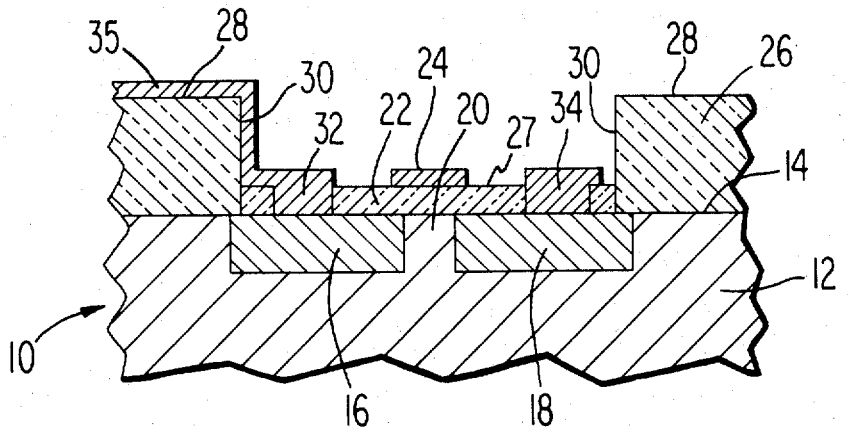
PRIOR ART Fig. 1.
FIG. 1 is a diagrammatic cross sectional view of a portion of an integrated circuit device of the type to which the present invention is applicable.

A typical integrated circuit device 10 to which the present invention is applicable is shown in FIG. 1. The device 10 is an insulated gate field effect transistor device which includes a plurality of insulated gate field effect transistors of the MOS type, only one of which is shown in FIG. 1. The device 10 includes a body 12 of semiconductor material, typically silicon, which has a surface 14 adjacent to which the insulated gate field effect transistors are formed. Each transistor includes spaced source and drain regions 16 and 18 respectively which are separated by a channel region 20. A relatively thin gate insulator 22 separates a gate electrode 24 from the channel region 20. An insulating coating 26 of relatively greater thickness than that of the coating 22 is disposed on the surface 14 in generally surrounding relation to each of the several transistors in the device. The two insulating coatings 22 and 26 have upper surfaces 27 and 28, respectively, which are parallel and are bounded by a relatively steep riser surface 30. In a typical device, the insulator 22 is about 1000 A, or 0.1 micrometers, thick and the coating 26 is preferably at least about 1.8 micrometers thick, so that the space between the sufaces 27 and 28 is at least 1.7 micrometers. Generally stated, this structure constitutes a substrate having spaced parallel surfaces connected by a relatively high step.

Contacts 32 and 34 are made to the source and drain regions 16 and 18, respectively, and deposited conductors extend from these contacts and from the gate electrode 24 up onto the surface 28 of the coating 26 to connect the transistor shown to other elements of the circuit. Only one deposited conductor is shown, at 35, extending from the source contact 32.

In an actual device, the riser surface 30 is not absolutely perpendicular to the surface of the insulating coatings, as shown, but is substantially perpendicular to these surfaces. In the manufacture of the device 10, the insulating coating 26 is first formed substantially to the desired thickness. Because of its relatively great thickness, this coating is preferably formed by chemical vapor phase deposition, e.g., by the thermal decomposition of silane ($SiH_4$) in the presence of oxygen. Such coatings should preferably be annealed after formation. Thereafter, a photomask called the "step oxide" photomask is used to define the areas to be occupied by transistors. The material of the coating 26 is then removed by etching at these locations. The material of the coating 26 is substantially uniform in density and the etching procedes at such a rate that a very little side cutting occurs. After the aforementioned etching step, the exposed surface 14 is oxidized to form the gate insulator 22, and contact openings to accommodate the source and drain contacts 32 and 34 are defined and etched in known manner. A continuous metal coating is then deposited, by vacuum evaporation for example, and a contact and interconnection pattern is formed in this coating by known photolithographic techniques. The interconnection conductors, such as the conductor 35, usually have the form of elongated strips with parallel sides. See FIG. 2 which illustrates in pictorial form the extension of a striplike conductor 35, with parallel sides 36 and 37, over an oxide step in a prior device.

Figure 2:
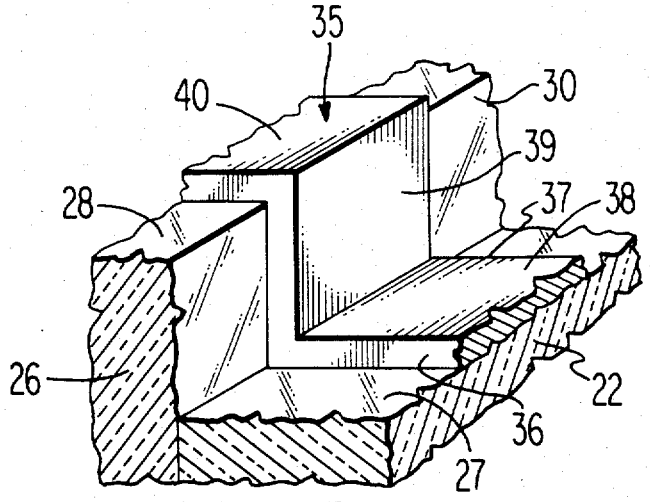
PRIOR ART Fig. 2.
FIG. 2 is an idealized partial perspective view of a metal layer crossing an insulator step in a prior art device.
Figure 3:
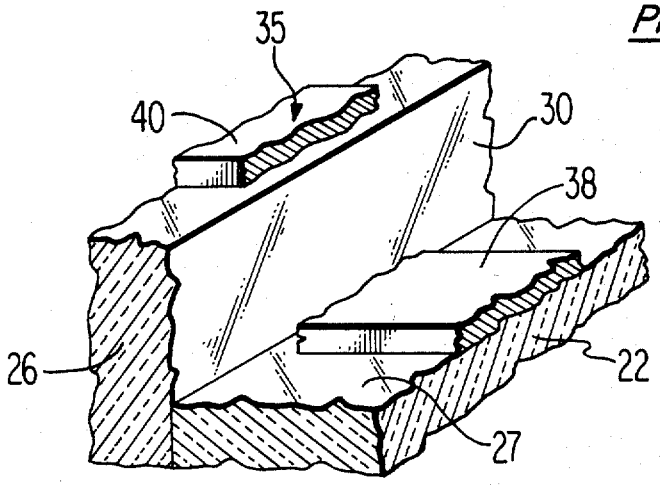
PRIOR ART Fig. 3.
FIG. 3 is a representation of a typical open circuit condition in a prior art device.

As shown in FIG. 2, the conductor 35 has a portion 38 on and adhered to the surface 27 of the insulator 22, a portion 39 on and adhered to the riser surface 30, and a portion 40 on the surface 28 of the insulator 26. If the conductor 35 is continuous as shown there is no problem. It often occurs, however, that the conductor 35 does not cross the step continuously and the circuit is accordingly inoperative. As illustrated in FIG. 3, for example, the portion 37 of the conductor 35 adjacent to the riser surface 30 may not be present. Open circuits of this type have been observed in defective devices by microscopic examination.

Figure 4:
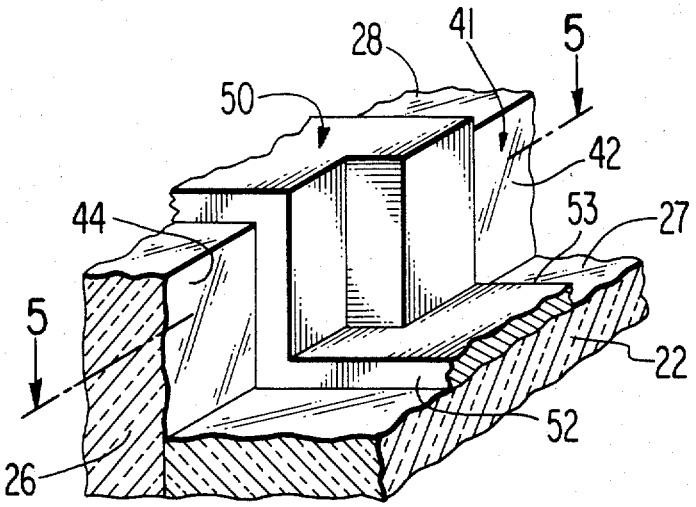
FIG. 4 is an idealized partial perspective view of a meta layer crossing an insulator step in the present novel device.
Figure 5:
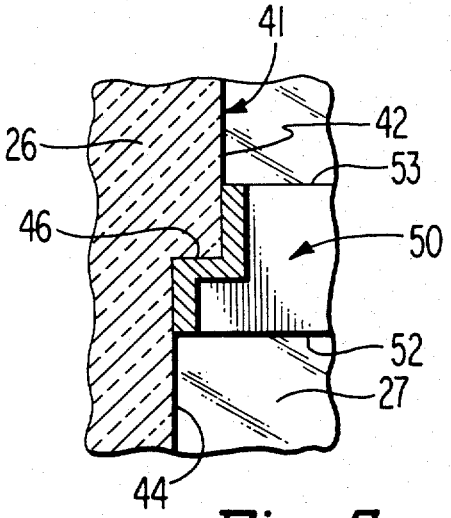
FIG. 5 is a cross section on lines 5—5 of FIG. 4.
Figure 6:
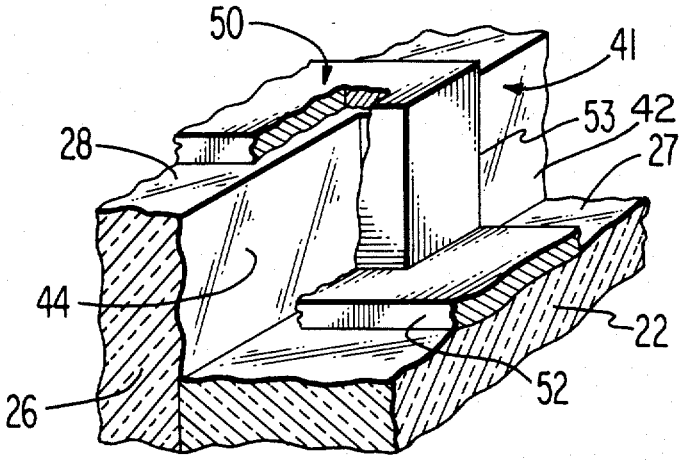
FIG. 6 is a representation of a typical defective crossing in the present novel device.

The present novel structure is illustrated in FIGS. 4 to 6. In the present device, the riser surface, here designated 41, between the first and second surfaces 27 and 28 of the coatings 22 and 26 is provided with at least two non-coplanar portions 42 and 44 which, in this example, occupy two offset, parallel planes each of which extends from the first parallel surface 27 to the second parallel surface 28. In the present example, these planes are bounded by a third portion 46 (FIG. 5) of the riser surface 41, which also is non-coplanar to the other two portions 42 and 44 since it extends perpendicular to the other two portions 42 and 44 A pendicular to the other two portions 42 and 44. A metal striplike conductor 50 having spaced parallel sides 52 and 53 extends from the surface 27 of the insulator 22 up the riser surface 41 onto the surface 28 of the insulator 26. In this example, the sides 52 and 53 of the conductor 50 are perpendicular to the planes of the portions 42 and 44 of the riser surface 41 and parallel to the third portion 46 of the riser surface. Other angular relationships are possible, as long as the offset portions of the riser surface are within the boundaries, i.e., between the sides, of the conductor.

The illustrated configuration of the riser surface 41 is exemplary, only. The surfaces 42 and 44 need not be parallel and the surface 46 need not be perpendicular to these. Moreover, additional non-coplanar surfaces may be provided at conductor crossings within the boundaries of the conductor. In general, the non-coplanar surfaces may be said to extend between surfaces 27 and 28 of the oxide coatings 22 and 26, or, where the non-coplanar surfaces are intersecting flat planes, the line of intersection between them is transverse to the surfaces 27 and 28. The configuration described for the riser surface 41 may be produced by the simple expedient of forming the "step oxide" photomask with the appropriate shape at the crossing locations.

A typical defective crossing in the present novel device as it appears on microscopic examination is shown in FIG. 6. In this example, the portion of the metal conductor 50 adjacent to the surface 44 of the riser surface 41 is missing. However, the remaining portions are still present so that the conductor 50 is electrically continuous. While the reason for this result is not known with certainty it is believed that the deposited metal does not adhere well to the riser surfaces, leaving tunnel voids. During etching of the metal to produce the interconnection pattern, the etching solution may seep into these voids and etch the metal away from its back side. This undercutting apparently stops for some reason at the surface 46.

Other reasons for the improvement in the present device may be the following. The effective width of the metal conductor adjacent to the riser surfaces is increased, thereby providing more metal at the locations where opens have been observed to be most likely. Because of the different angular relationships of the several portions of the riser surface, chances of line-of-sight shadowing during the metal evaporation process are reduced.

Whatever the reasons, the empirical results of testing devices having the present novel structure have shown a significant increase in yield. For example, an integrated circuit device which includes 1700 transistors, requiring for its operability approximately 5,000 metal crossings of high steps without an open circuit, had a yield of 0 to 1 percent when constructed in accordance with the prior art. By introducing the mask change required to form the offset at the steps, a yield of 5 to 10 percent was achieved.

The present invention is not limited to metal crossings of steps between two insulator layers. It applies as well wherever a deposited metal strip must cross a high step. Steps of this kind may exist, for example, between a thick insulator and base semiconductor material at the boundaries of contact openings. Likewise, such steps may exist in epitaxial silicon-on-sapphire structures in which a metal may extend from the sapphire surface up onto a silicon island.

What is claimed is:

1. A semiconductor device of the type which includes a metal layer on and adhered to a substrate, said substrate having first and second spaced parallel surfaces connected by a riser surface defining a relatively high step, *said substrate comprising a silicon body having an insulating silicon dioxide coating thereon, said silicon dioxide coating having thick and thin portions, said first and second parallel surfaces being a surface of said thin portion of said coating and a surface of said thick portion of said coating respectively, and said riser surface being a surface of said thick portion of said coating, said riser surface being generally elongated in a given direction*, said metal layer extending from said first of said parallel surfaces over said riser surface to said second of said parallel surfaces, *said metal layer having the form of an elongated strip with parallel sides, the direction of elongation of said metal layer being at an angle to that of said riser surface*, said riser surface of said step being substantially perpendicular to each of said first and said second parallel surfaces, in which at the location where said metal layer extends from said first to said second surface and within the boundaries of said metal layer, said riser surface has at least two non-coplanar portions, each of which extends from said first parallel surface to said second parallel surface.

2. A device as defined in claim 1 wherein said two portions of said riser surface lie in spaced, parallel planes [effect].

3. A device as defined in claim 2 wherein said two portions are joined by a third portion of said riser surface which lies in a plane perpendicular to those of said two portions.

4. A device as defined in claim 3 wherein [said metal layer has the form of an elongated strip with parallel sides,] each side [being] *of said metal layer is* substantially parallel to the plane of said third portion and substantially perpendicular to the planes of said two portions of said riser surface.

[5. A device as defined in claim 1 wherein said substrate comprises a silicon body having an insulating silicon dioxide coating thereon, said coating having thick and thin portions, said first and second spaced parallel surfaces being surfaces of said portions of said insulating coating.]

6. A device as defined in claim [5] *1* wherein the space between said surfaces of said insulating coating is greater than about 1.7 micrometers.

7. A device as defined in claim 6 wherein said two portions of said riser surface occupy spaced, parallel planes.

8. A device as defined in claim 7 wherein said two portions are joined by a third portion of said riser surface which occupies a plane perpendiculr to those of said two portions.

9. A device as defined in claim 8 wherein said metal layer has the form of an elongated strip with parallel sides, each side being substantially parallel to the plane of said third portion and substantially perpendicular to the planes of said two portions of said riser surface.

10. A device as defined in claim 9 wherein said device includes a plurality of insulated gate field effect transistors, the thin portions of said insulating coating constituting gate insulators for said insulated gate field effect transistors and being about 1000 A thick, the thick portions of said insulating coating being greater than about 1.8 micrometers thick.

[11. A semiconductor device of the type which includes a metal layer on and adhered to a substrate, said substrate having first and second spaced parallel surfaces connected by a riser surface defining a relatively high step, said metal layer extending from said first of said parallel surfaces over said riser surface to said second of said parallel surfaces, said riser surface of said step being substantially perpendicular to each of said first and second parallel surfaces, in which at the location where said metal layer extends from said first to said second surface, and within the boundaries of said metal layer, said riser surface has at least two non-coplanar portions in the form of intersecting flat planes, the line of intersection between said flat planes being transverse to said first and second parallel surfaces.]

* * * * *